(12) United States Patent
Batruni (10) Patent No.: US 7,602,321 B2
(45) Date of Patent: Oct. 13, 2009

(54) ADAPTIVE COMPOSITE ANALOG TO DIGITAL CONVERTER

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 0 days.

(21) Appl. No.: 11/904,613

(22) Filed: Sep. 27, 2007

(65) Prior Publication Data
US 2008/0084337 A1   Apr. 10, 2008

Related U.S. Application Data

(60) Provisional application No. 60/848,088, filed on Sep. 29, 2006.

(51) Int. Cl.
*H03M 1/06* (2006.01)
(52) U.S. Cl. ........................ 341/118; 341/155
(58) Field of Classification Search ................. 341/118, 341/120, 139, 155
See application file for complete search history.

(56) References Cited

U.S. PATENT DOCUMENTS

| | | | |
|---|---|---|---|
| 5,168,459 A | 12/1992 | Hiller | |
| 6,560,447 B2 * | 5/2003 | Rahman et al. | 455/232.1 |
| 6,956,517 B1 | 10/2005 | Baker et al. | |
| 7,365,662 B2 * | 4/2008 | Marsili et al. | 341/118 |
| 2004/0233081 A1 * | 11/2004 | Cesura et al. | 341/118 |
| 2005/0219088 A1 | 10/2005 | Batruni | |
| 2006/0098763 A1 * | 5/2006 | Meyer | 375/323 |

\* cited by examiner

*Primary Examiner*—Brian Young
(74) *Attorney, Agent, or Firm*—Van Pelt, Yi & James LLP (57) ABSTRACT

A distortion correcting analog to digital converter (ADC) system includes a plurality of ADCs configured to convert an analog signal to a plurality of digital ADC outputs, wherein the plurality of ADCs are configured to generate a composite signal based on the plurality of ADC outputs, there is an offset between a first one of the plurality of ADC outputs and a second one of the plurality of ADC outputs, and the offset causing distortion in the composite signal. The distortion correcting ADC system further includes an adaptive module coupled to the plurality of ADCs, wherein the adaptive modules includes an adaptive filter having a filter response, and the adaptive module is configured to adaptively adjust the filter response to reduce the distortion in the composite signal. An adaptive module includes an interface configured to receive a composite signal that is a combination of a plurality of ADC outputs, and an adaptive filter coupled to the interface, wherein there is an offset between a first one of the plurality of ADC outputs and a second one of the plurality of ADC outputs, the offset causing distortion in the composite signal, the adaptive filter has a filter response, and the adaptive filter is configured to adapt the filter response to reduce the distortion.

24 Claims, 9 Drawing Sheets

ADAPTIVE COMPOSITE ANALOG TO DIGITAL CONVERTER

CROSS REFERENCE TO OTHER APPLICATIONS

This application claims priority to U.S. Provisional Patent Application No. 60/848,088 entitled INTERLEAVE DISTORTION filed Sep. 29, 2006 which is incorporated herein by reference for all purposes.

BACKGROUND OF THE INVENTION

A composite analog to digital converter (ADC or A-to-D) is a device comprising a plurality of ADCs. Each of the ADC components may be a discrete ADC device, an ADC functional block in an integrated circuit, or any other appropriate circuitry for converting an analog signal to digital. An analog signal is processed by the ADCs, and the outputs of the ADCs are combined to generate a composite digital output signal. The composite ADC can be used in a wide range of applications such as communications and digital imaging. It can achieve high performance at a relatively low cost since the ADC components are often less expensive devices with lower performance.

Figure 1A:
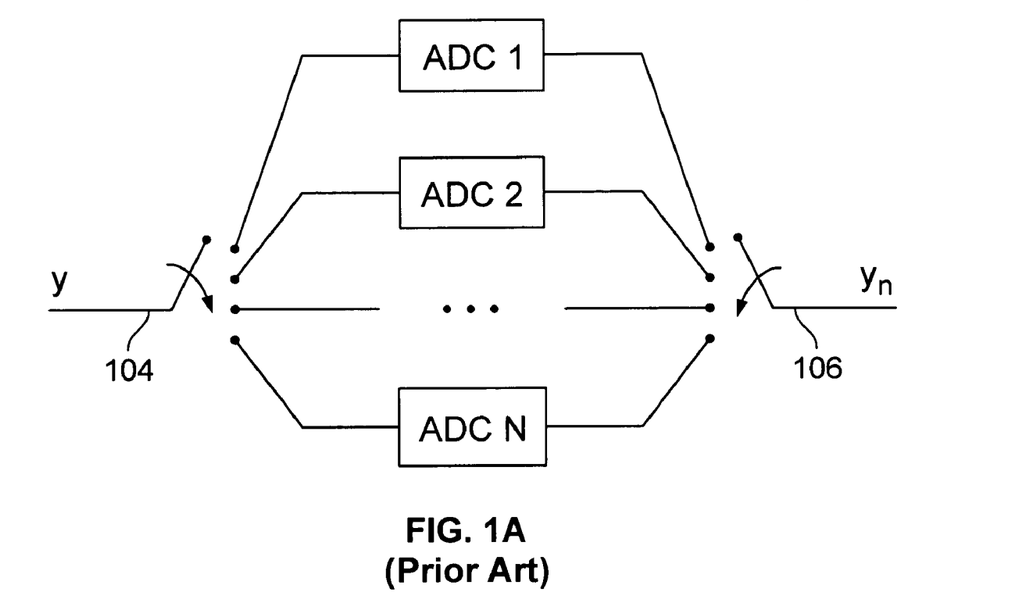
FIGS. 1A-1B illustrate composite ADC embodiments.

FIG. 1A illustrates a composite ADC embodiment. In the example shown, composite ADC 100 is arranged in an interleaving configuration. ADCs 1-N each have a sampling rate of $F_s$. The analog input signal y is sampled and selectively switched into the ADCs, via a switch 104, at a sampling rate of $NF_s$. The outputs of the ADCs are selected by a switch 106 and interleaved into an output sequence $y_n$ at a rate of $NF_s$. Thus, interleaving allows a high speed composite ADC to be constructed using a number of lower speed ADCs.

Figure 1B:
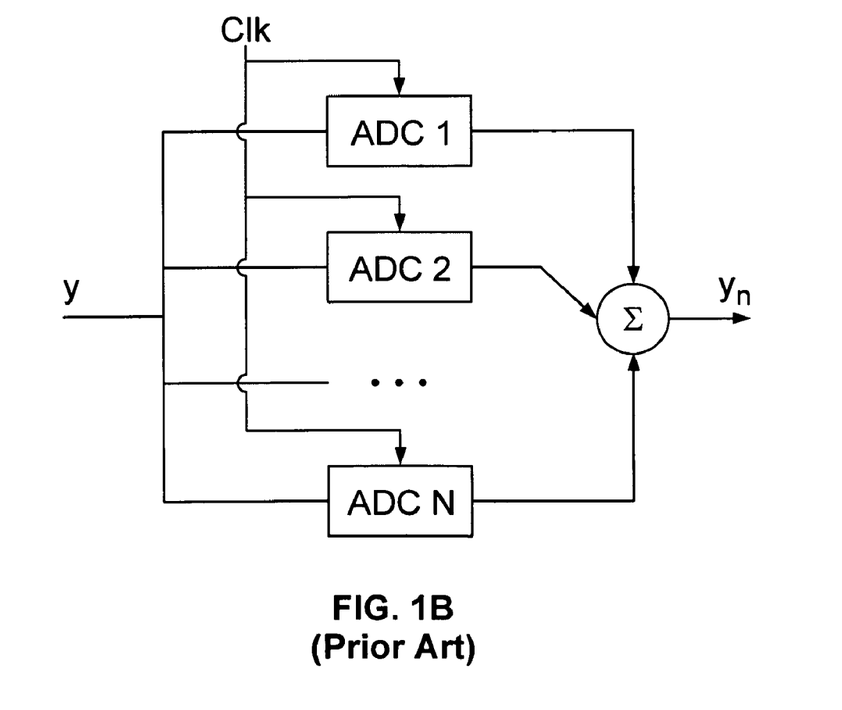

FIG. 1B illustrates another composite ADC embodiment. Composite ADC 150 is in a parallel configuration in this example. ADC components 1-N each have a sampling rate of $F_s$. The input signal y is sent to all the ADCs simultaneously, and the sampled outputs are summed at 152. The combined signal strength is N times the signal strength of one ADC. The resulting noise, however, only increases at ½ the rate of the signal strength increase. Thus, the resulting signal has a higher signal to noise ratio than the individual ADC components.

Figure 2A:
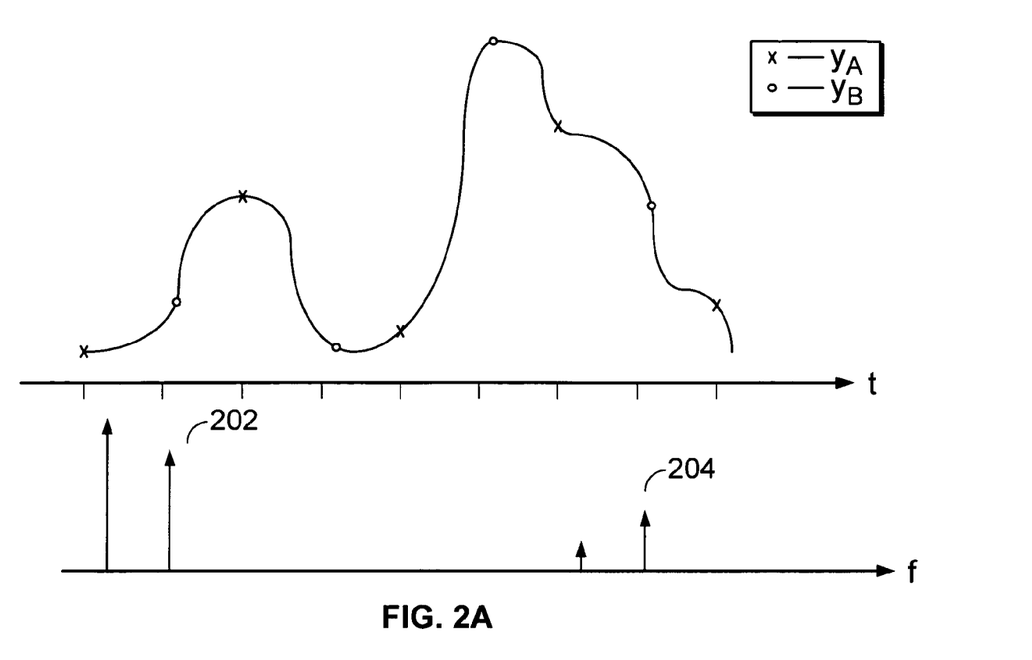
FIGS. 2A-2B are signal diagrams illustrating the effects of the mismatch in example composite ADCs that include two component ADCs.
Figure 2B:
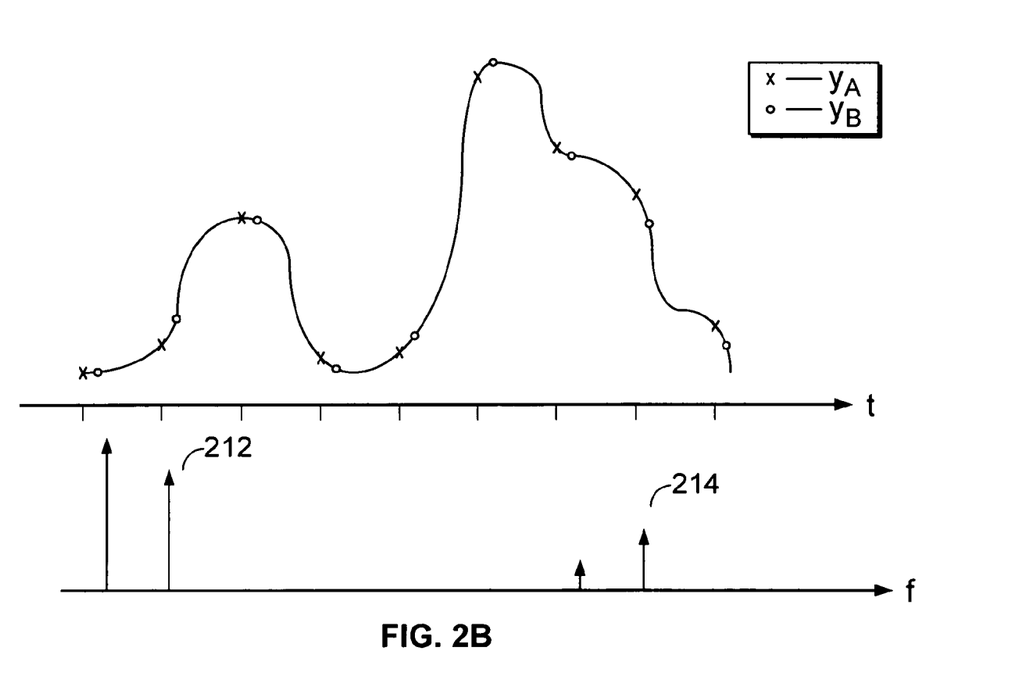

Although composite ADCs offer performance gains, mismatch in the component ADCs, including mismatch in clock phase, signal path gain, and/or device characteristics often leads to signal distortions. FIGS. 2A-2B are signal diagrams illustrating the effects of the mismatch in example composite ADCs that include two component ADCs. FIG. 2A shows the signal diagrams of an interleaved composite ADC example. The input switched into the ADCs is controlled by a clock that has a duty cycle of approximately 50%. Signals $y_A$ and $y_B$ are outputs of components ADC1 and ADC2, respectively. The sampling point are shown for purposes of illustration and do not necessarily correspond to the actual sampling rate. Ideally, the sampling phases for the two ADCs are at 50% duty cycle. In practice, however, there is a phase mismatch of δ between the samples of the two ADCs, as well as an amplitude mismatch. Thus, there is distortion in the composite signal 200 attributed to aliasing in the resulting composite signal $y_n$. The frequency domain diagram shows desired signal 202 and aliased image 204.

Similarly, in FIG. 2B where the signal diagrams of a parallel composite ADC example are shown, there is an offset in the samples of the two ADCs, causing aliasing effects in the output signal $y_n$. In the frequency domain diagram, images 212 and 214 correspond to the desired signal and the aliased image, respectively. The aliased image is undesirable since it may cause interference with adjacent frequency channels. Furthermore, since the frequency location of the aliased image is not necessarily known a priori and may vary over time, it would be difficult to configure a conventional error correction filter to compensate for the distortion.

It would be useful, therefore, to have a technique for correcting output distortions in composite ADCs. It would also be desirable if the technique is flexible enough to compensate for distorted outputs at unknown, varying frequency locations.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Correcting distortion in a composite signal generated by a plurality of ADCs is disclosed. In some embodiments, an adaptive module that includes an adaptive filter adjusts the filter phase delay to reduce the distortion. The adaptation is based at least in part on a cost function. In some embodiments, the cost function includes an energy measurement of the distortion.

Figure 3:
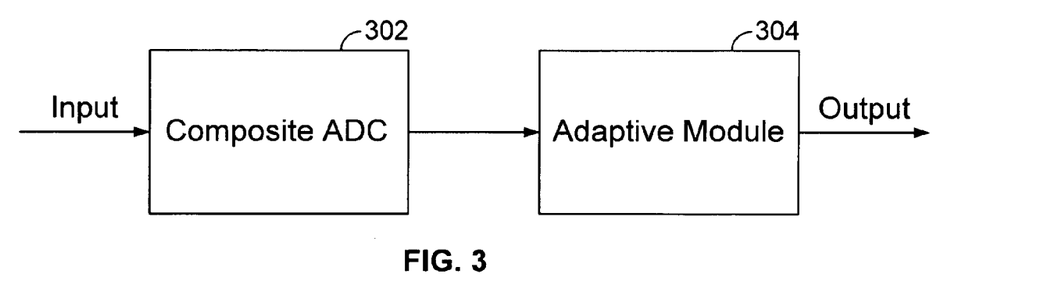
FIG. 3 is a block diagram illustrating an error correcting composite ADC embodiment.

FIG. 3 is a block diagram illustrating an error correcting composite ADC embodiment. In this example, composite ADC 302 includes a plurality of ADC components. Each of the ADC components may be a discrete ADC device, an ADC functional block in an integrated circuit, or any other appropriate circuitry for converting an analog signal to digital. In various embodiments, the composite ADC is an interleaved composite ADC similar to 100 of FIG. 1A, a parallel composite ADC similar to 150 of FIG. 1B, or other types of composite ADC comprising a plurality of ADCs. An analog input signal is received, and a composite signal with distortion is generated by the composite ADC. The distorted composite signal is sent to an adaptive module 304, which may be implemented as a discrete component, a part of an integrated circuit, or any other appropriate ways. The adaptive module adapts its filter response, including the filter's phase delay and/or the filter's amplitude response to reduce the distortion in the composite signal.

For purposes of illustration, most examples below show a composite ADC with two ADC components, although the technique is also applicable to composite ADCs with a greater number of ADCs. The individual ADCs generate digital signal components $y_A$ and $y_B$, which have a phase offset and/or an amplitude offset due to mismatch in the ADC components and/or signal path. Components $y_A$ and $y_B$ combine to generate $y_n$, which has distortion, specifically an aliased image of the desired signal as a result of the offset.

In an interleaved composite signal, let $y_A$ be the odd time sequence $\{y_{2m+1}, y_{2m+3}, y_{2m+5}, y_{2m+7}, \ldots\}$ and $y_B$ be the even time sequence with an offset $\{y_{2m+1+\delta}, y_{2m+3+\delta}, y_{2m+5+\delta}, y_{2m+7+\delta}, \ldots\}$. Since the offset is relative, $y_A$ is arbitrarily chosen as the reference signal and the phase offset is denoted as $\delta$. The composite signal, therefore, can be expressed as follows:

$\{y_{2m}, y_{2m+1+\delta}, y_{2m+2}, y_{2m+3+\delta}, \ldots\} = \{y_{\bar{n}}, y_{\bar{n}+1}, y_{\bar{n}+2}, y_{\bar{n}+3}, \ldots\} = y_{\bar{n}}$, where the time index $\bar{n}$ is shorthand for each new time point in the non-ideal sampled interleaved signal sequence.

Figure 4:
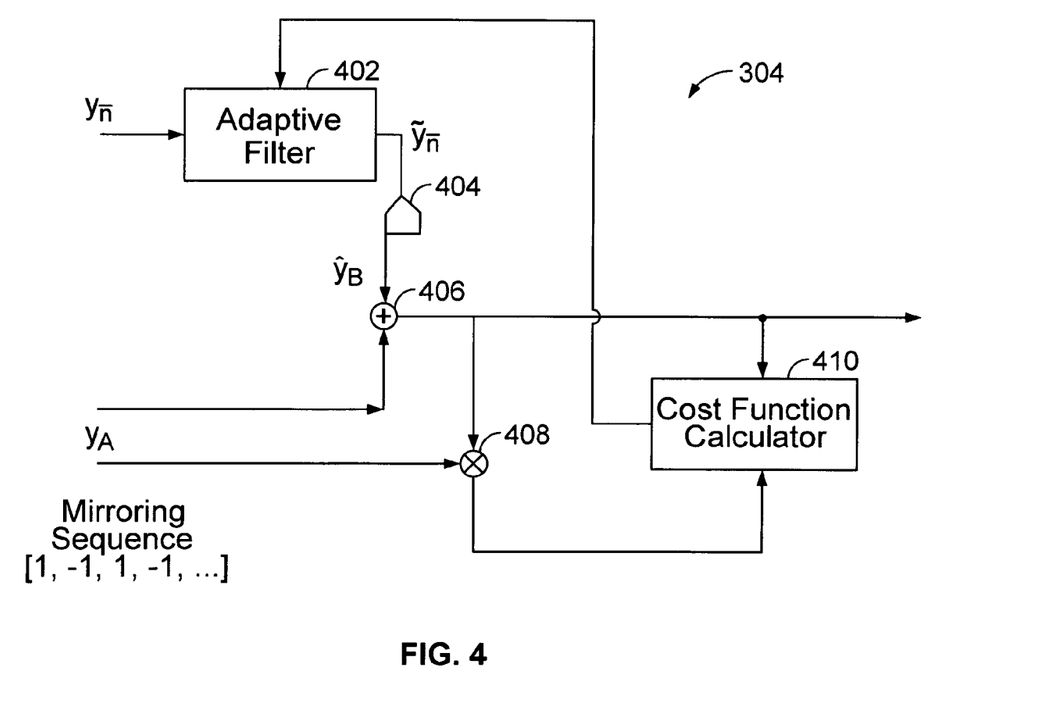
FIG. 4 is a block diagram illustrating an embodiment of an adaptive module.

FIG. 4 is a block diagram illustrating an embodiment of an adaptive module. In this example, adaptive module 304 includes interfaces configured to receive a composite signal $y_n$ and a reference signal $y_A$. In various embodiments, the interfaces may be implemented as serial or parallel interfaces or any other appropriate connection. The module further includes an adaptive filter 402 (some times also referred to as an adaptive digital signal processor). The filter response is adaptable. In this example, the filter is configured adapt a phase delay to reduce distortion. Also included is a mirror modulator 408 configured to modulate the delayed composite signal by multiplying it with a mirroring sequence of [c, −c, c, −c, . . . ], where c is a constant and chosen as 1 in some embodiments for the sake of convenience. Further included is a cost function calculator 410, which computes a cost function and sends the result to the adaptive phase filter for adjusting the filter's phase delay.

The adaptive module operates as follows: the received composite signal sequence with phase offset is denoted as $y_{\bar{n}} = \{y_{2m}, y_{2m+1+\delta}, y_{2m+2}, y_{2m+3+\delta}, \ldots\}$. The energy of the distorted component in $y_{\bar{n}}$ (i.e., the aliased image) can be measured by computing the cross-correlation of $y_{\bar{n}}$ and its mirror modulated form $\tilde{u}_{\bar{n}} = \{y_{2m}, -y_{2m+1+\delta}, y_{2m+2}, -y_{2m+3+\delta}\}$ as follows:

$$r_{00} = y_{2m}^2 - y_{2m+1+\delta}^2 + y_{2m+2}^2 - y_{2m+3+\delta}^2 + \cdots$$

$$= \lim_{N \to \infty} \frac{1}{N} \left[ \sum_{k=-N}^{N} y_{2k}^2 - \sum_{k=-N}^{N} y_{2k+1+\delta}^2 \right].$$

Based on this formula, if the offset $\delta = 0$, $$\sum_{k=-N}^{N} y_{2k}^2 \text{ and } \sum_{k=-N}^{N} y_{2k+1+\delta}^2$$

are equal and $r_{00} = 0$. If $\delta \neq 0$, $$\sum_{k=-N}^{N} y_{2k}^2 \text{ and } \sum_{k=-N}^{N} y_{2k+1+\delta}^2$$

are not equal and therefore $r_{00} \neq 0$. Thus, the correlation factor $r_{00}$ can be used to measure the extent of a phase offset a in the sampling clock of the composite signal. Adjustments can be made to the phase delay of the composite signal such that the distortion energy as determined using the correlation factor, and in turn the sampling offset, is minimized. Although the example shows in detail a composite input signal that is the result of two interleaved ADCs, the adaptive module also works for a composite input resulting from two parallel ADCs.

Figure 5A:
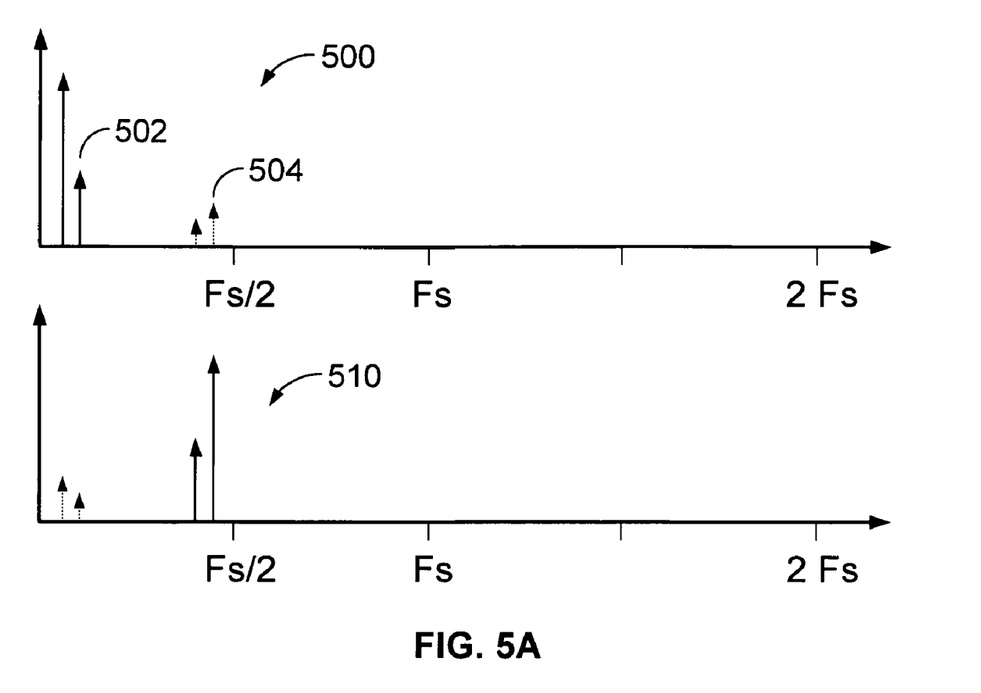
FIGS. 5A-5B are example frequency domain signal diagrams illustrating the relationship of sampling phase offset and the cross-correlation function.
Figure 5B:
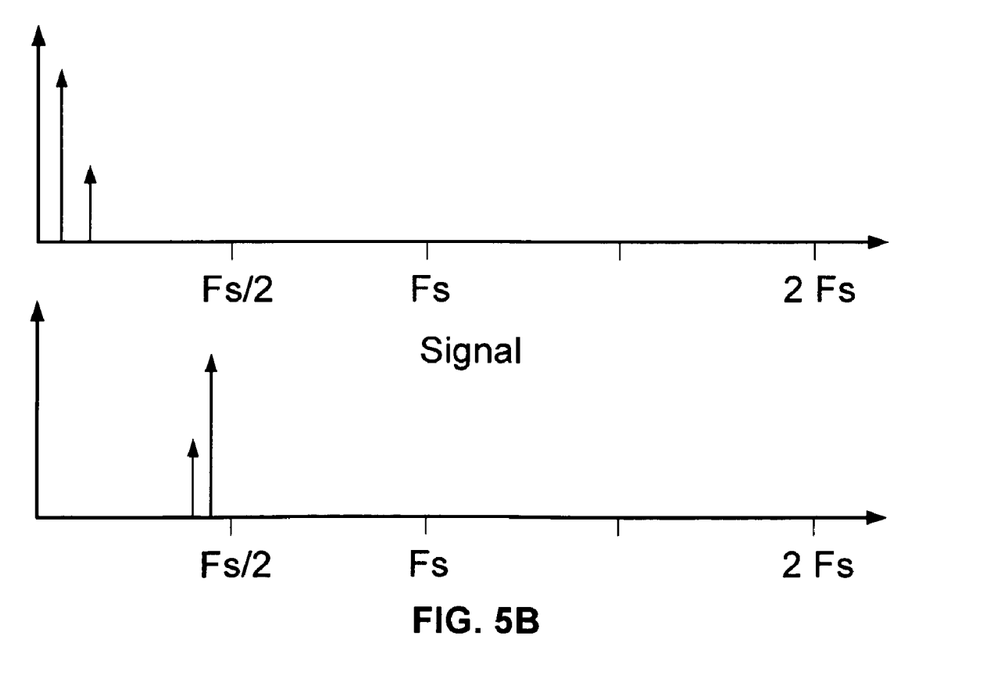

FIGS. 5A-5B are example frequency domain signal diagrams illustrating the relationship of sampling phase offset and the cross-correlation function. In FIG. 5A, composite signal 500 includes interleaved image 502 and aliased image 504 due to sampling phase offset. Mirror-modulated signal 510 is signal 500 "flipped" relative to center frequency $F_s/2$. Signals 500 and 510 include correlated tones at the same frequencies, resulting in a non-zero cross-correlation value. In contrast, composite signal 550 of FIG. 5B does not have any aliased image because the signal has no clock offset. The resulting mirror-modulated signal 560 does not have tones located at the same frequencies as signal 550. In other words, signals 550 and 560 are uncorrelated and have a cross-correlation value of zero.

Figure 6:
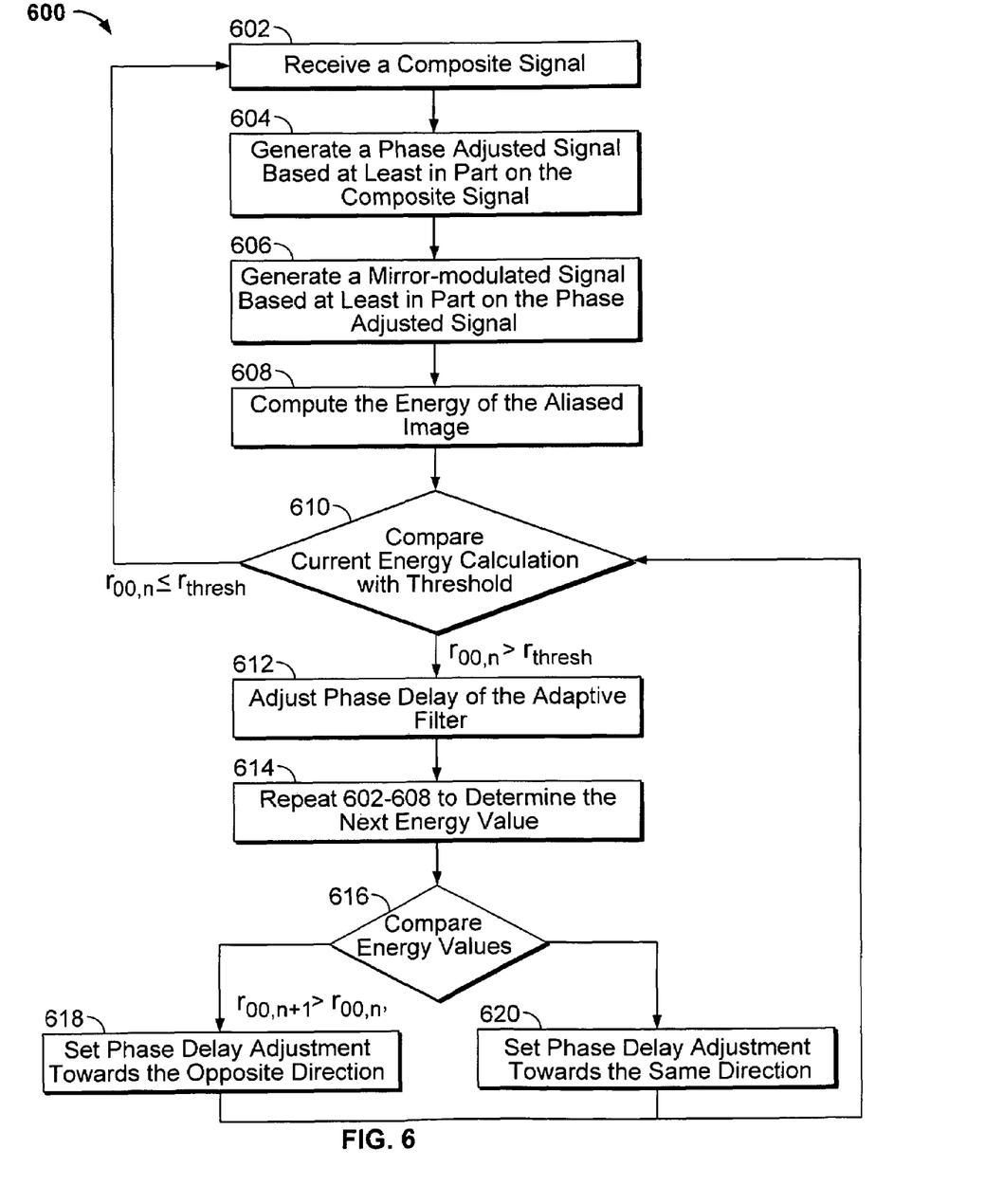
FIG. 6 is a flowchart illustrating an embodiment of a process for correcting distortion in a composite signal.

FIG. 6 is a flowchart illustrating an embodiment of a process for correcting distortion in a composite signal. In this example, process 600 initiates when a composite signal, $y_{\bar{n}}$, is received (602). The phase of the composite signal is adjusted to generate a phase adjusted signal, denoted as $\tilde{y}_{\bar{n}}$ (604). The phase adjusted signal is mirror-modulated to generate a mirror-modulated sequence $\tilde{u}_{\bar{n}}$ (606). In this embodiment, to compute the energy of the aliased image, the cross-correlation function of $\tilde{y}_{\bar{n}}$ and $\tilde{n}_{\bar{n}}$ is computed (608), generating a cross-correlation value $r_{00,n} = E\{\tilde{y}_{\bar{n}}, \tilde{u}_{\bar{n}}\}$. In some embodiments, the energy is computed using other formulas such as the simplified formula $$r_{00,n} = \sum_{j=0}^{P} \tilde{y}_{\bar{n}-j} \cdot \tilde{u}_{\bar{n}-j}.$$

The current energy value, $r_{00,n+1}$, is compared with a predefined threshold value $r_{thresh}$ (610). If the energy of the aliased image is at or below the threshold, it indicates that the phase delay has been sufficiently compensated. The system continues to monitor the energy level and the process repeats at 602. If, however, the energy is greater than the threshold, it indicates that the phase delay of the adaptive filter has not sufficiently compensated for the offset. Thus, the phase delay of the adaptive filter is adjusted (612) and 602-608 are repeated based on input signal $y_{\bar{n}+1}$ to generate the next energy value, $r_{00,n+1}$.

The next energy value $r_{00,n+1}$ and the previous energy value $r_{00,n}$ are compared (616). If $r_{00,n+1} > r_{00,n}$ it indicates that the phase adjustment has resulted in an increase in the energy of the aliased signal. Thus, the phase delay to be used in the next cycle, $\delta_{n+1}$, is set in the opposite direction of the current phase delay $\delta_n$ (618). In other words, if $\delta_n$ is positive, $\delta_{n+1}$ is set to be a negative value and vice versa. If, however, $r_{00,n+1} < r_{00,n}$ it indicates that the phase adjustment has reduced the energy of the aliased image and the phase delay in the next cycle, $\delta_{n+1}$, should be adjusted in the same direction as the current phase delay $\delta_n$, (620). The process repeats at 610.

Referring to FIG. 4, process 600 may be implemented on adaptive module 304. In this example, $y_{\bar{n}}$ is received and sent to adaptive phase filter 402. Adjusting the phase of the composite signal $y_{\bar{n}}$ to generate a phase adjusted signal $\tilde{y}_{\bar{n}}$ is accomplished by sending the composite signal to adaptive phase filter 402. Given an input composite signal $y_{\bar{n}} = \{y_{2m}, y_{2m+1+\delta}, y_{2m+2}, y_{2m+3+\delta}, \ldots\}$ the output of the phase filter $y_{\bar{n}} = \{\tilde{y}_{2m+\rho}, \tilde{y}_{2m+1+\delta+\rho}, \tilde{y}_{2m+2+\rho}, \tilde{y}_{2m+3+\delta+\rho}\}$. Note that $y_{\bar{n}}$ and $\tilde{y}_{\bar{n}}$ have different time indices $\bar{n}$ and $\hat{n}$ because of the phase shift $\rho$ introduced by the adaptive phase filter.

$\tilde{y}_n$ is sent to a phase splitter 404 which splits off the odd samples and generates an even sequence $\{0, \tilde{y}_{2m+1+\delta+\rho}, \tilde{y}_{2m+3+\delta+\rho}, 0, \ldots\}$. The sequence is combine with the odd output samples from other ADC, $y_A = \{y_{2m}, 0, y_{2m+2}, 0, \ldots\}$, to form a new sequence $\{y_{2m}, \tilde{y}_{2m+1+\delta+\rho}, y_{2m+2}, \tilde{y}_{2m+3+\delta+\rho}, y_{2m+4}, \ldots\}$. Here, if the phase filter could supply a delay such that $\delta+\rho=0$, then there would be no signal image effect or phase offset. The combined sequence is mirror-modulated (i.e., multiplied with a mirroring sequence $[1, -1, 1, -1, \ldots]$ to generate $\{y_{2m}, -\tilde{y}_{2m+1+\delta+\rho}, y_{2m+2}, -\tilde{y}_{2m+3+\delta+\rho}, y_{2m+4}, \ldots\}$, or equivalently $\tilde{u}_{\bar{n}} = \{u_{2m}, u_{2m+1+\delta+\rho}, u_{2m+2}, u_{2m+3+\delta+\rho}, u_{2m+4}, \ldots\}$. The cost function, in this case the energy of the aliased image, $r_{00,n} = E\{\tilde{y}_{\bar{n}} \cdot \tilde{u}_{\bar{n}}\}$, is determined by cost function calculator 410. In this example, the cost function calculator computes the energy as a cross correlation of $\tilde{y}_{\bar{n}}$ and $\tilde{u}_{\bar{n}}$. $r_{00,n}$ is sent to adaptive phase filter 402 to adjust the phase delay. The process is repeated by the module as needed, until the energy of the aliased image is below a predetermined threshold and $\delta+\rho \approx 0$.

Figure 7:
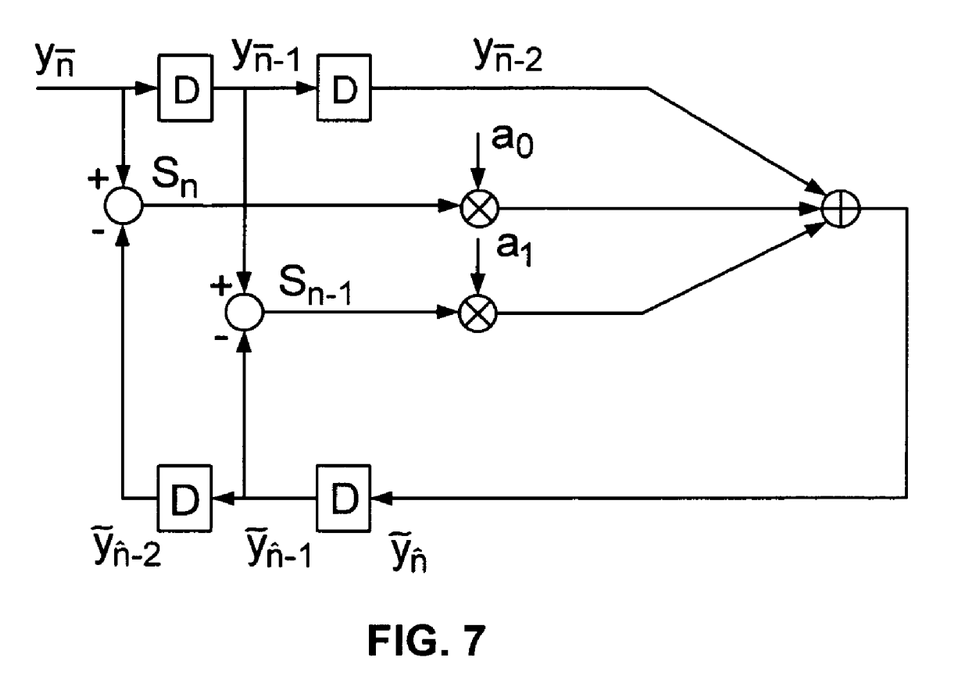
FIG. 7 is a block diagram illustrating an adaptive phase filter embodiment.

FIG. 7 is a block diagram illustrating an adaptive phase filter embodiment. In this example, adaptive phase filter 700 is an order-2 infinite impulse response (IIR) filter comprising delay blocks, multipliers and summers. The filter is described using the following z-domain transfer function:

$$H(z) = \frac{a_0 + a_1 z^{-1} + z^{-2}}{1 + a_1 z^{-1} + a_0 z^{-2}}$$

An alternative expression of the filter characteristic in the time domain is $\tilde{y}_n = a_0 y_{\bar{n}} + a_1 y_{\bar{n}-1} + y_{\bar{n}-2} - a_1 y_{n-1} - a_0 \tilde{y}_{\bar{n}-2} = a_0 (y_{\bar{n}} - \tilde{y}_{n-2}) + a_1 (y_{\bar{n}-1} - \tilde{y}_{n-1}) + y_{\bar{n}-2}$. The filter has a flat amplitude response, and a non-flat phase response. The phase delay of the filter can adjusted by adjusting the values of $a_0$ and $a_1$. In some embodiments, to adjust the filter's phase delay, $a_0$ is kept constant while $a_1$ is gradually adjusted. Once a satisfactory phase is achieved, $a_1$ is held constant while $a_0$ is gradually adjusted to further improve the result. The process repeats until the aliased signal energy falls below the threshold value. In some embodiments, both coefficients are adjusted at the same time.

The above example shows an order-2 filter. In some embodiments, filters of order N are implemented based on the same principle. Such a filter has a generalized time domain form of $r_n = \tilde{a}_0(y_n - r_{n-N}) + \tilde{a}_1 (y^{n-1} - r_{n-N+1}) + \ldots + y_{n-N}$. To adjust the phase offset, some embodiments employ a round robin scheme in which each of the coefficients is adjusted while the rest are held constant.

Figure 8:
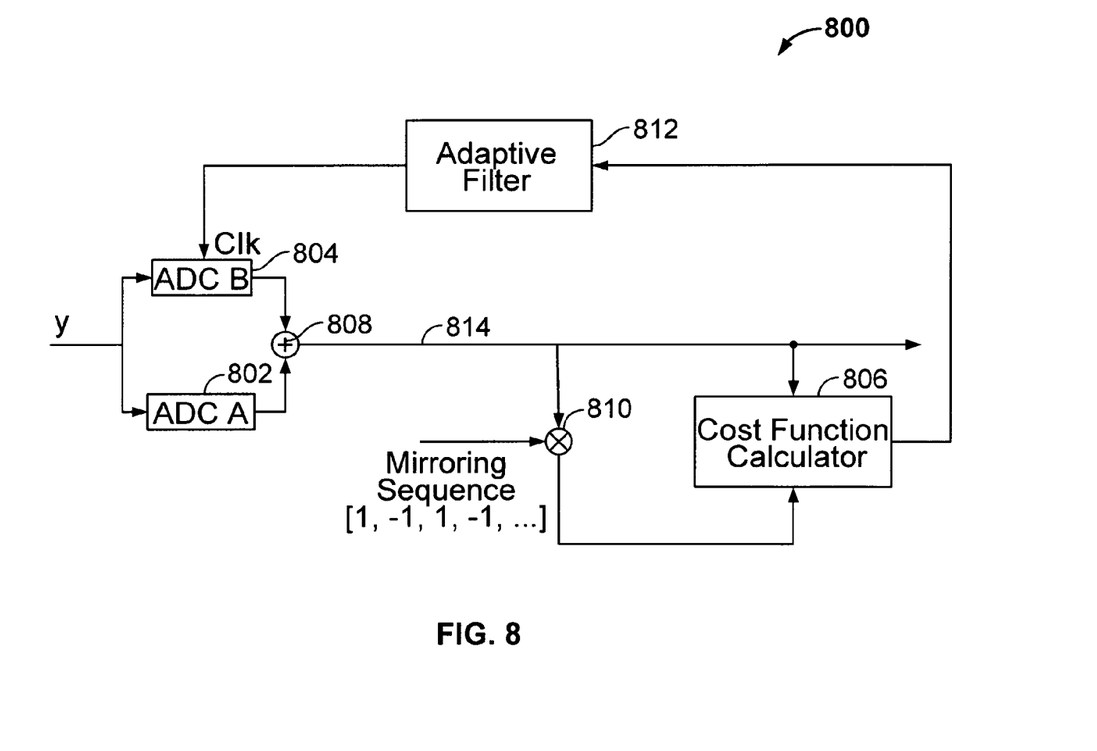
FIG. 8 is a block diagram illustrating another embodiment of an error correcting composite ADC.

FIG. 8 is a block diagram illustrating another embodiment of an error correcting composite ADC. In this example, the composite ADC 800 includes ADCs 802 and 804. The adaptive module includes an adaptive filter 812, which adjusts the phase of the sampling clock used by ADC 804 to sample the analog input y. The output of ADC 804 is combined with the output of reference ADC 802 at 808, generating signal 814 that is modulated with a mirroring sequence at 810. In this example, signal 814 is both the composite signal and the phase adjusted signal. Cost function calculator 806 computes the cross correlation of the composite signal and the mirror-modulated signal, feeding back the result to adaptive filter 812. The adaptation of the phase delay of adaptive filter 812 reduces the phase offset in the output of ADC 804, thereby reducing distortion.

In some embodiments, the adaptive module adjusts for amplitude offsets between ADC outputs. Circuits similar to FIG. 4 or FIG. 8 may be used to implement the adaptive module, and the adaptive filter configuration may be altered as appropriate. To adjust for an amplitude offset, a filter coefficient of the adaptive filter is increased or decreased according to the cost function results. The filter coefficient is initialized with a value of 1, and is multiplied with the output of the non-reference ADC (for example, ADC B in FIG. 8). If there is no amplitude mismatch, the coefficient does not change and presence of the adaptable filter does not affect the output sequence. The resulting cost function would indicate that there is no mismatch since the energy of the distortion component would be approximately zero. If, however, there is amplitude mismatch, the coefficient adapts to a value of $1+\delta$ such that when the filter coefficient is multiplied with the output of the non-reference ADC, $\delta$ compensates for the amplitude disparity between the ADCs and reduce the cost function value. The adaptation repeats until the cost function indicates that the offset is at an acceptable level.

Figure 9:
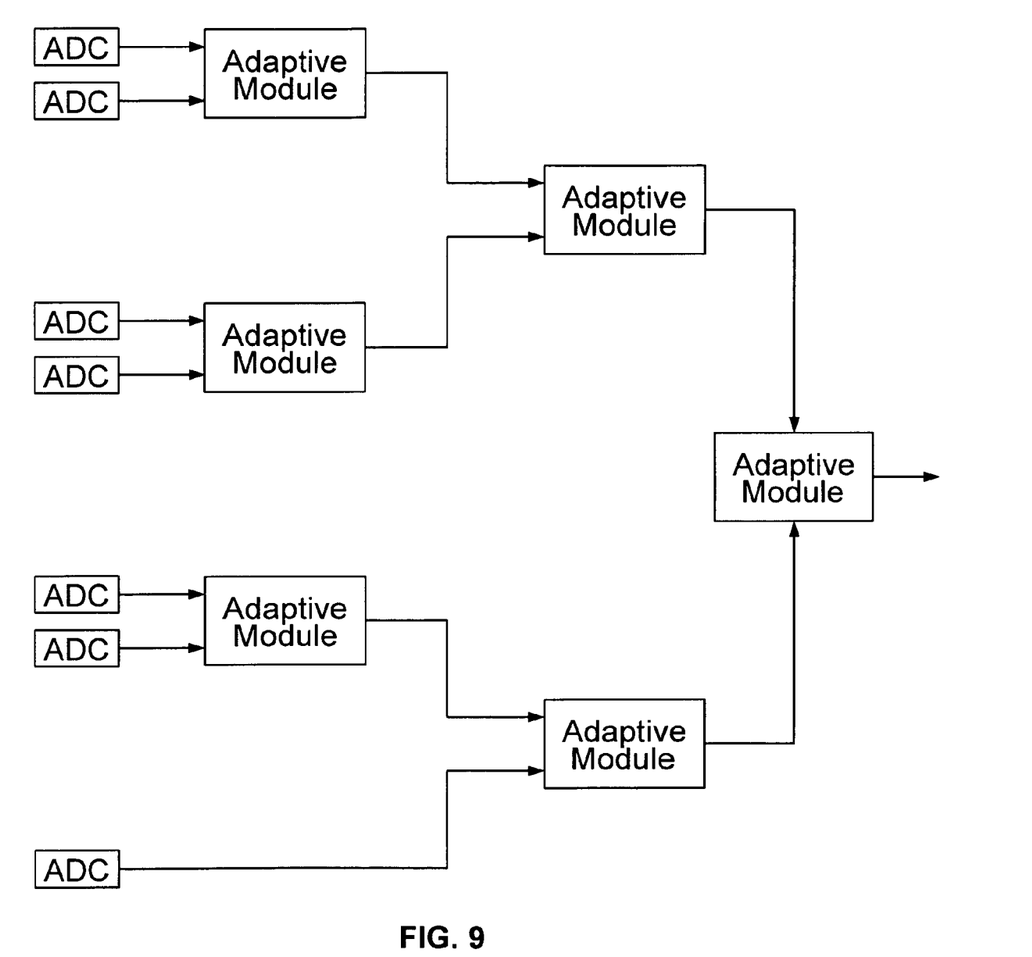
FIG. 9 is a block diagram illustrating another embodiment of an error correcting composite ADC.

FIG. 9 is a block diagram illustrating another embodiment of an error correcting composite ADC. In this example, composite ADC 900 includes a greater number of ADCs than the examples shown previously. A pair of ADCs send their outputs to an adaptive modules, which in turn sends its output to another adaptive module. By cascading the adaptive modules, an error correcting composite ADC comprising an arbitrary number of component ADCs is achieved.

Distortion correction for a composite signal generated by a plurality of ADCs has been disclosed. The technique described above is applicable to composite signals generated by ADCs in various configurations, including interleaved configurations and parallel configurations.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A distortion correcting analog to digital converter (ADC) system, comprising:
    a plurality of ADCs configured to convert an analog signal to a plurality of digital ADC outputs, wherein:
        the plurality of ADCs are configured to generate a composite signal based on the plurality of ADC outputs;
        there is an offset between a first one of the plurality of ADC outputs and a second one of the plurality of ADC outputs, the offset causing distortion in the composite signal; and
    an adaptive module coupled to the plurality of ADCs, wherein:
        the adaptive modules includes an adaptive filter having a filter response; and
        the adaptive module is configured to adaptively adjust the filter response to reduce the distortion in the composite signal.

2. The system of claim 1, wherein the offset includes a phase offset.

3. The system of claim 1, wherein adaptively adjusting the filter response includes adaptively adjusting a filter phase delay.

4. The system of claim 1, wherein the offset includes an amplitude offset.

5. The system of claim 1, wherein adaptively adjusting the filter response includes adaptively adjusting a filter coefficient.

6. The system of claim 1, wherein the adaptation is based at least in part on a cost function.

7. The system of claim 6, wherein the cost function measures energy of the distortion.

8. The system of claim 6, wherein the cost function is determined based on a cross-correlation function of a phase adjusted signal and a mirror-modulated signal.

9. The system of claim 8, wherein the mirror-modulated signal is generated based at least in part on a mirroring sequence.

10. The system of claim 1, wherein the adaptive filter includes a finite impulse response (IIR) filter.

11. The system of claim 1, wherein adaptively adjusting the filter response includes adjusting a first filter coefficient while keeping a second filter coefficient constant.

12. The system of claim 1, wherein the adaptive module is one of a plurality of adaptive modules, and the plurality of adaptive modules are arranged in a cascade configuration.

13. A method of generating a distortion corrected digital signal, comprising:
    converting an analog signal to a plurality of digital signals;
    generating a composite signal based on the plurality of digital signals; wherein there is an offset between a first one of the plurality of ADC outputs and a second one of the plurality of ADC outputs, the offset causing distortion in the composite signal;
    sending the composite signal to an adaptive module that includes an adaptive filter having a filter response; and
    adaptively adjust the filter response to reduce the distortion in the composite signal.

14. The method of claim 13, wherein adaptively adjusting the filter response includes adaptively adjusting a filter phase delay.

15. The method of claim 13, wherein adaptively adjusting the filter response includes adaptively adjusting a filter coefficient.

16. The method of claim 13, wherein the adaptation is based at least in part on a cost function.

17. The method of claim 16, wherein the cost function measures energy of the distortion.

18. The method of claim 16, further comprising determining the cost function, based on a cross-correlation function of a phase adjusted signal and a mirror-modulated signal.

19. The method of claim 18, further comprising generating a mirror-modulated signal based at least in part on a mirroring sequence.

20. The method of claim 13, wherein adaptively adjusting the filter response includes adjusting a first filter coefficient while keeping a second filter coefficient constant.

21. An adaptive module, comprising:
    an interface configured to receive a composite signal that is a combination of a plurality of ADC outputs; and
    an adaptive filter coupled to the interface; wherein:
        there is an offset between a first one of the plurality of ADC outputs and a second one of the plurality of ADC outputs, the offset causing distortion in the composite signal;
        the adaptive filter has a filter response; and
        the adaptive filter is configured to adapt the filter response to reduce the distortion; wherein
        adapting the filter response includes adaptively adjusting a filter phase delay.

22. An adaptive module, comprising:
    an interface configured to receive a composite signal that is a combination of a plurality of ADC outputs; and
    an adaptive filter coupled to the interface; wherein:
        there is an offset between a first one of the plurality of ADC outputs and a second one of the plurality of ADC outputs, the offset causing distortion in the composite signal;
        the adaptive filter has a filter response; and
        the adaptive filter is configured to adapt the filter response to reduce the distortion; wherein
        adapting the filter response to reduce the distortion is based at least in part on a cost function that measures energy of the distortion.

23. A method of generating a distortion corrected digital signal, comprising:
    receiving a composite signal that is a combination of a plurality of digital signals;
    wherein there is an offset between a first one of the plurality of ADC outputs and a second one of the plurality of ADC outputs, the offset causing distortion in the composite signal; and
    adapting a filter response of an adaptive filter to reduce the distortion; wherein
    adapting the filter response includes adaptively adjusting a filter phase delay.

24. A method of generating a distortion corrected digital signal, comprising:
    receiving a composite signal that is a combination of a plurality of digital signals;

wherein there is an offset between a first one of the plurality of ADC outputs and a second one of the plurality of ADC outputs, the offset causing distortion in the composite signal; and adapting a filter response of an adaptive filter to reduce the distortion; wherein adapting the filter response to reduce the distortion is based at least in part on a cost function that measures energy of the distortion.

* * * * *